US010396779B2

(12) United States Patent
Chawla

(10) Patent No.: US 10,396,779 B2
(45) Date of Patent: Aug. 27, 2019

(54) GROUND SWITCHING FOR SPEAKER CURRENT SENSE

(71) Applicant: TEXAS INSTRUMENTS INCORPORATED, Dallas, TX (US)

(72) Inventor: Mohit Chawla, Belgaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 82 days.

(21) Appl. No.: 15/852,132

(22) Filed: Dec. 22, 2017

(65) Prior Publication Data
US 2018/0351547 A1 Dec. 6, 2018

(30) Foreign Application Priority Data

May 31, 2017 (IN) .............................. 201741019064

(51) Int. Cl.
G01R 19/25 (2006.01)
H03K 17/687 (2006.01)
(Continued)

(52) U.S. Cl.
CPC ......... *H03K 17/6871* (2013.01); *G01R 19/25* (2013.01); *H03F 1/26* (2013.01); *H03F 1/3205* (2013.01); *H03F 3/185* (2013.01); *H03F 3/2173* (2013.01); *H04R 29/001* (2013.01); *H03F 2200/03* (2013.01); *H03F 2200/481* (2013.01)

(58) Field of Classification Search
CPC ......................... H03F 3/2173; H03F 2200/03; H03F 3/2171; H03F 1/52; H03F 1/523; H03F 3/185; H03F 2200/481; H03F 2200/405; H03F 2203/45594; H03F 3/2175; H03F 1/0205; H03F 2200/33; H03F 2200/432; H03F 2200/462; H03F 2203/45526; H03F 3/217; H03F 3/3091; H03F 3/393; H03F 3/45179; H03F 3/68; H03F 1/083; H03F 3/3076; H04R 29/001; H04R 3/007; H04R 1/1008; H04R 1/1041; H04R 5/033;
(Continued)

(56) References Cited

U.S. PATENT DOCUMENTS 3,495,181 A * 2/1970 Reiffin .................. H03F 1/52
330/263
8,143,944 B2 * 3/2012 Siniscalchi ........... H03F 3/2173
330/207 A
(Continued)

*Primary Examiner* — Vinh P Nguyen
(74) *Attorney, Agent, or Firm* — John R. Pessetto; Charles A. Brill; Frank D. Cimino

(57) ABSTRACT

A circuit includes a pair of high side transistors, a pair of low side transistors, a first sense resistor coupled to one of the low side transistors at a first sense node, and a second sense resistor coupled to another of the low side transistors at a second sense node. The first and second sense resistors couple together at a ground node. The circuit includes a first switch network coupled to the first sense resistor, a second switch network coupled to the second sense resistor, a first pair of switches configured to selectively provide a potential of the ground node or a potential of the first sense node as a ground potential to the first switch network, and a second pair of switches configured to selectively provide the potential of the ground node or a potential of the second sense node as a ground potential to the second switch network.

20 Claims, 2 Drawing Sheets

(51) Int. Cl.
*H03F 3/217* (2006.01)
*H03F 3/185* (2006.01)
*H04R 29/00* (2006.01)
*H03F 1/26* (2006.01)
*H03F 1/32* (2006.01)

(58) Field of Classification Search
CPC .... H04R 9/02; G01R 19/16571; G01R 19/25; G01R 31/024; H03K 17/6871
See application file for complete search history.

(56) References Cited

U.S. PATENT DOCUMENTS 8,963,634 B2 * 2/2015 Srivastava .............. H03F 1/523
  330/207 A
9,960,741 B2 * 5/2018 Mengad .................. H03F 3/393

* cited by examiner

GROUND SWITCHING FOR SPEAKER CURRENT SENSE

RELATED APPLICATIONS

This application claims priority to India Provisional Application No. 201741019064, filed May 31, 2017, which is hereby incorporated by reference.

BACKGROUND

A speaker is driven by an amplifier. A speaker comprises an inductive load on the amplifier. As such, a phase difference exists between current through and voltage to the speaker. Some amplifiers are Class-D amplifiers which include a switching regulator. The voltage on an output terminal of a Class-D amplifier becomes negative in a recycle mode for the amplifier. That is, for a speaker amplifier operated from a power supply and ground, one node or the other of the speaker may experience a negative voltage.

Negative voltages on the speaker nodes poses a problem for systems which measure speaker current. The measure of speaker current can be used to assess speaker temperature and excursion. Negative voltages cause complications for switches connected to sense nodes on the output of the amplifier. Such switches may experience leakage current due to the negative voltages, which in turn causes accuracy, linearity and total harmonic distortion and noise problems.

SUMMARY

In one example, a circuit includes a pair of high side transistors, a pair of low side transistors coupled to the pair of high side transistors, a first sense resistor coupled to one of the low side transistors at a first sense node, and a second sense resistor coupled to another of the low side transistors at a second sense node. The first and second sense resistors are coupled together at a ground node. The circuit further includes a first switch network coupled to the first sense resistor, a second switch network coupled to the second sense resistor, a first pair of switches configured to selectively provide a potential of the ground node or a potential of the first sense node as a ground potential to the first switch network, and a second pair of switches configured to selectively provide the potential of the ground node or a potential of the second sense node as a ground potential to the second switch network.

In another example, a circuit includes a pair of high side transistors coupled to a power supply node, a pair of low side transistors coupled to the pair of high side transistors, a first sense resistor coupled to one of the low side transistors at a first sense node, a second sense resistor coupled to another of the low side transistors at a second sense node. The first and second sense resistors are coupled together at a ground node. The circuit further includes a first switch network coupled to the second sense resistor and comprising a first resistor, a second resistor, and a first plurality of switches. The first plurality of switches is configured to selectively couple the first resistor between the first sense node and a first output node of the first switch network and between the ground node and a second output node of the first switch network. The circuit also includes a second switch network coupled to the second sense resistor and comprising a third resistor, a fourth resistor, and a second plurality of switches. The second plurality of switches is configured to selectively couple the third resistor between the second sense node and a third output node of the second switch network and between the ground node and a fourth output node of the second switch network.

In yet another example, an apparatus includes a pair of high side transistors coupled to a power supply node, a pair of low side transistors coupled to the pair of high side transistors, a first sense resistor coupled to one of the low side transistors at a first sense node, a second sense resistor coupled to one of the other of the low side transistors at a second sense node, wherein the first and second sense resistors are coupled together at a ground node, and an analog-to-digital converter (ADC). The apparatus also includes a first switch network coupled to the first sense resistor and, via first and second output nodes, to the ADC, a second switch network coupled to the second sense resistor and, via third and fourth output nodes, to the ADC, a first pair of switches configured to use a sign bit from the ADC to selectively provide a potential of the ground node or a potential of the first sense node as a ground potential to the first switch network, and a second pair of switches configured to use the sign bit from the ADC to selectively provide the potential of the ground node or a potential of the second sense node as a ground potential to the second switch network.

BRIEF DESCRIPTION OF THE DRAWINGS

For a detailed description of various examples, reference will now be made to the accompanying drawings in which.

DETAILED DESCRIPTION

Figure 1:
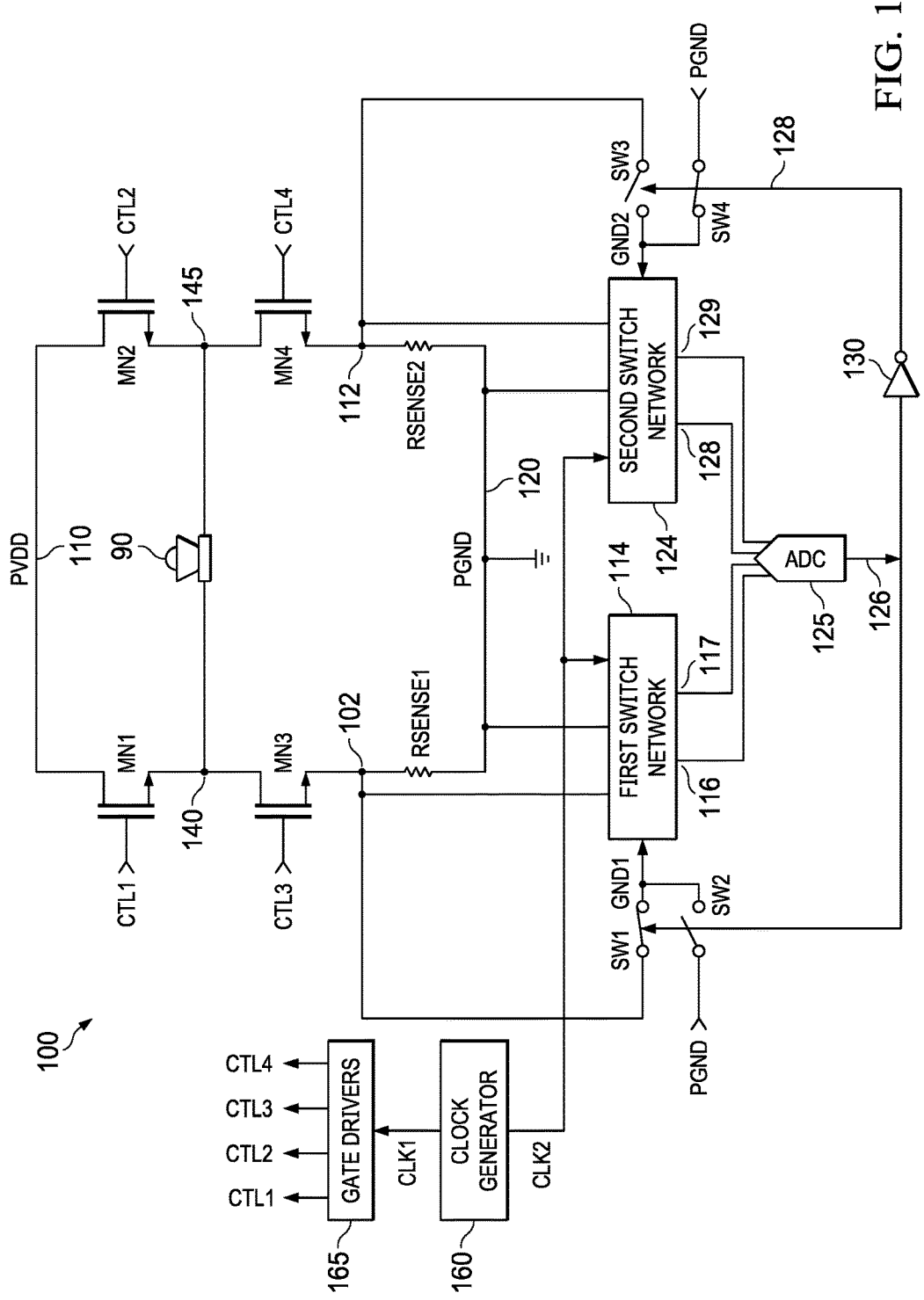
FIG. 1 illustrates a system comprising switch networks coupled between current sense resistors and an analog-to-digital converter in accordance with an illustrative example.

FIG. 1 shows an example of a system 100 comprising a circuit for driving an inductive load such as a speaker 90. The disclosed circuit comprises a pair of high side transistors MN1 and MN2, a pair of low side transistors MN3 and MN4, and first and second sense resistors RSENSE1 and RSENSE2. RSENSE1 couples to low side transistor MN3 at a node 102, also referred to herein as sense node 102. Similarly, RSENSE2 couples to low side transistor MN4 at a node 112, also referred to herein as sense node 112. The opposite ends of RSENSE1 and RSENSE2 also are coupled together at a ground node 120 (designated as PGND in FIG. 1).

The system 100 also includes a first switch network 114 and a second switch network 124. The first switch network 114 couples to RSENSE1. The second switch network 124 couples to RSENSE2. A first pair of switches comprising SW1 and SW2 couples to the first switch network 114. SW1 couples to sense node 102 and SW2 couples to the ground node 120. A second pair of switches comprising SW3 and SW4 couples to the second switch network 124. SW3 couples to sense node 112 and SW4 couples to the ground node 120. The first pair of switches SW1 and SW2 is configured to selectively provide the potential of the ground node 120 or the potential of the sense node 102 as a ground potential (GND1) to the first switch network 114. Similarly, the second pair of switches SW3 and SW4 is configured to selectively provide the potential of the ground node 120 or the potential of the sense node 112 as a ground potential (GND2) to the second switch network 124.

The circuit shown in FIG. 1 comprises circuitry (e.g., an amplifier) to drive, or support driving, a speaker 90. MN1-MN4 are power transistors and are n-type metal oxide semiconductor field effect transistors (NMOS devices) in the example shown. In other embodiments, the power transistors can be implemented as p-type metal oxide semiconductor field effect transistors (PMOS devices). The drains of the high side transistors MN1 and MN2 are coupled together at a power supply node 110 (PVDD). A positive power supply voltage can be provided to the power supply node 110 to operate the amplifier. The drain of MN3 is coupled to the source of MN1 at a node 140, and the drain of MN4 is coupled to the source of MN2 at a node 145. The speaker 90 (or other type of inductive load) can be coupled to nodes 140 and 145. The gates of MN1-MN4 are controlled by control signals CTL1, CTL2, CTL3, and CTL4, respectively as shown, to turn on and off the respective transistors. A clock generator 160 is included which provides a first clock (CLK1) to gate drivers 165. The gate drivers comprise buffers to assert the control signals CTL1, CTL2, CTL3, and CTL4 based on the timing specified by CLK1. The clock generator 160 also generates a second clock CLK2 which is used to control the timing of the first and second switch networks 114 and 124. In one embodiment, the frequency of CLK2 is an integer multiple of the frequency of CLK1. For example, the frequency of CLK1 may be 384 KHz and the frequency of CLK2 may be 768 KHz. In other examples, the frequency of CLK2 is not an integer multiple of the frequency of CLK1.

The transistors MN1-MN4 are configured as a class D amplifier and, as such, are controlled to operate in one of three configurations:

(1) MN1 and MN4 on, with MN2 and MN3 off, which causes current to flow from the power supply node 110, through MN1, through speaker 90, and through MN4 and RSENSE2 to the ground node 120;

(2) MN2 and MN3 on, with MN1 and MN4 off, which causes current to flow from the power supply node 110, through MN2, through speaker 90, and through MN3 and RSENSE1 to the ground node 120; and (3) MN3 and MN4 on, with MN1 and MN2 off, which causes current to flow in the loop comprising the speaker 90, MN3 and MN4 and the ground node 120 in one direction or the other depending on the charging of the inductor (which is an energy storage element due its inductive characteristic).

During each of the operational phases noted above, speaker current flows through one or the other of the sense resistors RSENSE1 and RSENSE2. Sense resistors RSENSE1 and RSENSE2 comprise sufficiently low resistance resistors so as not to impose much of an added load on the amplifier, but the voltage developed across the resistors is a function of the speaker current. The sense resistors' voltage is provided through the corresponding first switch network 114 and second switch network 124 to an analog-to-digital converter (ADC) 125. The ADC 125 is a multi-channel analog-to-digital converter and thus can receive multiple analog inputs for conversion to digital representations of the analog inputs. Thus, the ADC 125 is able to convert the voltages across RSENSE1 and RSENSE2 (which are proportional the current through speaker 90) to a digital representation. The first switch network 114 includes output nodes 116 and 117 coupled to the ADC 125. The second switch network 124 includes output nodes 128 and 129 coupled to the ADC 125.

The digital output signal from the ADC 125 may be a parallel or serial bit stream that digitally encodes the speaker current through RSENSE1 and/or RSENSE2. One of the output bits of the ADC 125, however, is a sign bit 126 which indicates whether the analog input voltage is positive or negative. In one example, the sign bit is derived from the ADC output and is not explicitly available as an output bit of the ADC. As noted above, the voltage on node 140 and/or node 145 may be negative during various phases of operation of the circuit shown in FIG. 1. As such, the voltage on sense node 102 and on sense node 112 also may be negative. The sign bit 126 from the ADC 125 indicates whether one of the sense resistors RSENSE1 and RSENSE2 is coupled to a positive or negative voltage on its sense node 102, 112. If the voltage on sense node 102 is negative, then the voltage on sense node 112 is positive, and vice versa. That is, the voltages on sense nodes 102 and 112 are not negative at the same time.

Figure 2:
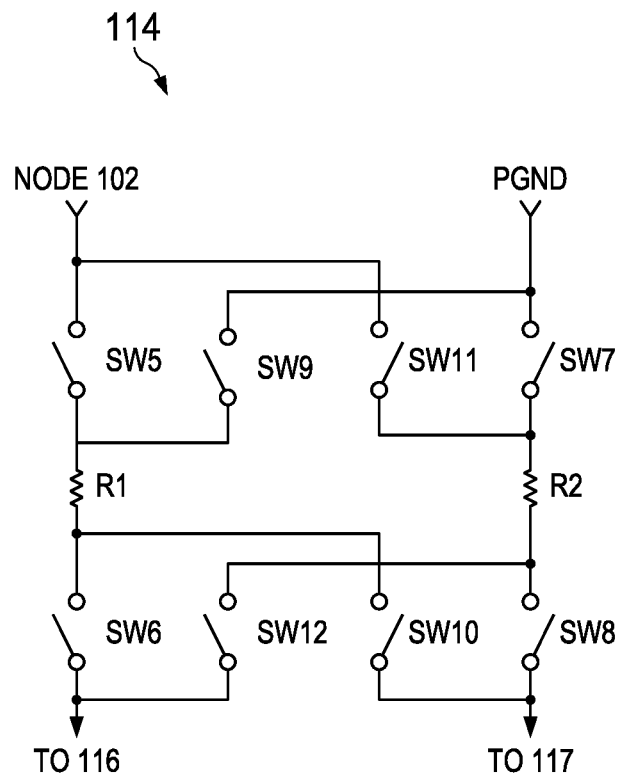
FIG. 2 shows an example of the switch networks of FIG. 1.

Each of the first and second switch networks 114, 124 comprises multiple switches and resistors. FIG. 2 provides an example of an implementation of the switch networks and will be discussed below. The switches and gate drivers included as part of the first and second switch networks 114, 124 have a ground potential. In accordance with the disclosed embodiments, the ground potential provided to the first and second switch networks is either the PGND or the potential on the corresponding sense node 102, 112. If the potential of sense node 102 is negative (i.e., below PGND), then the potential of the sense node 102 is provided to first switch network 114 as the ground potential to be used by the switches and gate drivers of the first switch network 114. If the potential of the sense node 102 is positive (i.e., above PGND), then PGND is provided as the ground potential to be used by the switches and gate drivers of the first switch network 114. Similarly, if the potential of sense node 112 is negative (i.e., below PGND), then the potential of the sense node 112 is provided to second switch network 124 as the ground potential to be used by the switches and gate drivers of the second switch network 124. If the potential of the sense node 112 is positive (i.e., above PGND), then PGND is provided as the ground potential to be used by the switches and gate drivers of the second switch network 124. As explained above, the switches SW1 and SW2 are used to selectively provide either the potential of the sense node 102 or PGND as the ground potential (designated as GND1 in FIG. 1) to the first switch network 114. Switches SW3 and SW4 are used to selectively provide either the potential of the sense node 112 or PGND as the ground potential (designated as GND2 in FIG. 1) to the second switch network 124.

The sign bit 126 from the ADC 125 is used to control the state of SW1 and SW2. If the sign bit 126 is, for example, a 1 (indicative of the potential on sense node 102 being negative), then the sign bit causes SW1 to close and SW2 to open thereby providing the potential of the sense node 102 as the ground potential GND1 to the first switch network 114. However, if the sign bit 126 is 0 (indicative of the potential on sense node 102 being positive), then the sign bit 126 causes SW1 to open and SW2 to close thereby providing PGND as the ground potential GND1 to the first switch network 114. The logic definition of the sign bit can be different that that described above in other embodiments (e.g., 1 indicating sense node 102 is positive and 0 indicating sense node 102 is negative).

As noted above, the potentials of the sense nodes 102 and 112 are never both negative at the same time—when sense node 102 has a negative potential, sense node 112 has a positive potential, and when sense node 112 has a negative potential, sense node 102 has a positive potential. Inverter 130 is included in the example of FIG. 1 to invert the sign bit 126 produce an inverted sign bit 128. When sign bit 126 is a 0, inverted sign bit is a 1, and vice versa. If sign bit 126 is a 0 (indicative of the potential on sense node 102 being negative), the inverted sign bit 128 will be a 1 (indicative of the potential on sense node 112 being positive), which thereby causes the potential on sense node 102 to be provided as GND1 to the first switch network 114 and PGND to be provided as GND2 to the second switch network 124. If sign bit 126 is a 1 (indicative of the potential on sense node 102 being positive), the inverted sign bit 128 will be a 0 (indicative of the potential on sense node 112 being negative), which thereby causes PGND to be provided as GND1 to the first switch network 114 and the potential on sense node 112 to be provided as GND2 to the second switch network 124.

FIG. 2 shows an example of an implementation of the first switch network 114. The upper end of the circuit shown in FIG. 2 illustrates connections to the sense node 102 and to PGND. The lower end of the circuit in FIG. 1 includes the first output node 116 and the second output node 117 for the first switch network 114. The switch network 114 comprises a first resistor R1, a second resistor R2 and switches SW5-SW12. SW5 couples sense node 102 to R1 and SV6 couples R1 to output node 116. SW7 couples PGND to R2 and SW8 couples R2 to output node 117. SW9 couples PGND to R1 and SW10 couples R1 to output node 117. SW11 couples sense node 102 to R2 and SW12 couples R2 to output node 116. The second switch network 124 may have the same or similar architecture to couple sense node 112 and PGND to output nodes 128 and 129.

In operation, some of the switches SW5-SW12 are on at the same time and the rest of switches SW5-SW12 are off, and vice versa. For example, when CLK2 is high, SW5-SW8 are on (closed) and SW9-SW12 are off (open). In that state, node 102 is coupled through SW5, R1, and SV6 to output node 116, and PGND is coupled through SW7, R2, and SW8 to output node 117. When CLK2 is low, SW5-SV8 are off (open) and SW9-SW12 are on (closed). In this state, node 102 is coupled through SW11, R2, and SW12 to output node 116, and PGND is coupled through SW9, R1, and SW10 to output node 117.

By reciprocally controlling the switches in this manner, R1 and R2 are repeatedly switched between being coupled between node 102/PGND and output nodes 116/118. As such, any mismatch in the resistors R1 and R2 (e.g., due to mismatch variations, or other factors) tends to average out, thereby relaxing the need to more closely match R1 to R2. As noted above, CLK2 is used to control the states of switches SW5-SW12 and has a frequency that, in some examples, is an integer multiple of the frequency of CLK1 (which is used to control the state of the power transistors MN1-MN4).

Figure 3:
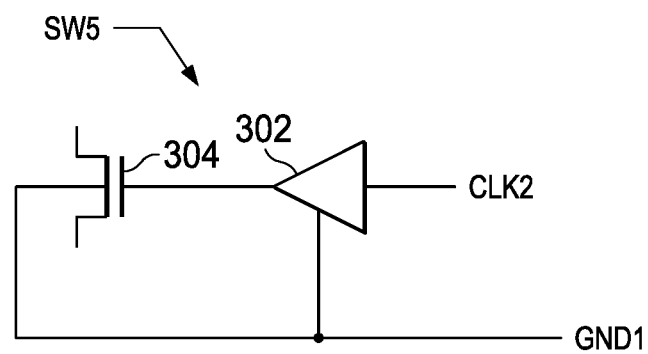
FIG. 3 shows an example of an individual switch included in the switch network of FIG. 2.

FIG. 3 shows an example of the implementation of SW5. The same or similar implementation can be used for any of switches SW6-SW12. SW5 comprises a buffer 302 coupled to a transistor 304. CLK2 is used as an input signal to buffer 304 and the output signal from buffer 302 controls the gate of transistor 304 to thereby turn the transistor 304 on and off. In one implementation, CLK2 is inverted for half of the switch buffers to open and close the switches SW5-SW12 as explained above. In another implementation, half of the buffers 302 used for switches SW5-SW12 are inverting buffers, in which case all of the switches SW5-SW12 receive the same polarity of CLK2. The buffer 302 includes the ground GND1, which as explained above is selectively either the PGND or the sense node 102, 112 potential). Further, the bulk (back gate) connection of the transistor 304 is connected to GND1.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit, comprising:
    a pair of high side transistors coupled to a power supply node;
    a pair of low side transistors coupled to the pair of high side transistors;
    a first sense resistor coupled to one of the low side transistors at a first sense node;
    a second sense resistor coupled to another of the low side transistors at a second sense node, wherein the first and second sense resistors are coupled together at a ground node;
    a first switch network coupled to the first sense resistor;
    a second switch network coupled to the second sense resistor;
    a first pair of switches configured to selectively provide a potential of the ground node or a potential of the first sense node as a ground potential to the first switch network; and
    a second pair of switches configured to selectively provide the potential of the ground node or a potential of the second sense node as a ground potential to the second switch network.

2. The circuit of claim 1, further comprising an analog-to-digital converter coupled to the first and second switch networks and configured to generate digital representations of current through each of the first and second sense resistors.

3. The circuit of claim 2, wherein a sign bit of the digital representation of the current through one of the first or second sense resistors is used to control the first pair of switches.

4. The circuit of claim 3, wherein the first pair of switches is configured such that the sign bit causes one of the first pair of switches to open while the other one of the first pair of switches is closed.

5. The circuit of claim 3, further comprising an inverter coupled to the analog-to-digital converter and configured to invert the sign bit to generate an inverted sign bit, wherein the inverted sign bit is used to control the second pair of switches.

6. The circuit of claim 5, wherein the second pair of switches is configured such that the inverted sign bit causes one of the second pair of switches to open while the other one of the second pair of switches is closed.

7. The circuit of claim 1, wherein the first switch network comprises:
a first resistor;
a second resistor; and
a third plurality of switches coupled to the first and second resistors, wherein the third plurality of switches are configured to selectively couple the first resistor between the first sense node and a first output node of the first switch network and between the ground node and a second output node of the first switch network.

8. The circuit of claim 7, further comprising an analog-to-digital converter coupled to the first and second output nodes of the first switch network.

9. The circuit of claim 7, wherein the second switch network comprises:
a third resistor;
a fourth resistor; and
a fourth plurality of switches coupled to the third and fourth resistors, wherein the fourth plurality of switches are configured to selectively couple the third resistor between the second sense node and a third output node of the second switch network and between the ground node and a fourth output node of the second switch network.

10. The circuit of claim 9, further comprising a first clock to control operation of the pairs of high side and low side transistors and a second clock to control operation of the third and fourth pluralities of switches, wherein a frequency of the second clock is an integer multiple of a frequency of the first clock.

11. An circuit, comprising:
a pair of high side transistors coupled to a power supply node;
a pair of low side transistors coupled to the pair of high side transistors;
a first sense resistor coupled to one of the low side transistors at a first sense node;
a second sense resistor coupled to one of the other of the low side transistors at a second sense node, wherein the first and second sense resistors are coupled together at a ground node;
a first switch network coupled to the first sense resistor and comprising a first resistor, a second resistor, and a first plurality of switches, wherein the first plurality of switches is configured to selectively couple the first resistor between the first sense node and a first output node of the first switch network and between the ground node and a second output node of the first switch network; and
a second switch network coupled to the second sense resistor and comprising a third resistor, a fourth resistor, and a second plurality of switches, wherein the second plurality of switches is configured to selectively couple the third resistor between the second sense node and a third output node of the second switch network and between the ground node and a fourth output node of the second switch network.

12. The circuit of claim 11, further comprising:
a third pair of switches configured to selectively provide a potential of the ground node or a potential of the first sense node as a ground potential to the first switch network; and
a fourth pair of switches configured to selectively provide the potential of the ground node or a potential of the second sense node as a ground potential to the second switch network.

13. The circuit of claim 12, further comprising an analog-to-digital converter (ADC) coupled to the first and second output nodes of the first switch network and to the third and fourth output nodes of the second switch network, wherein the ADC is configured to generate digital representations of current through each of the first and second sense resistors, and wherein a sign bit of the digital representation of the current through one of the first or second sense resistors is used to control the third and fourth pair of switches.

14. The circuit of claim 13, wherein the sign bit causes one of the second pair of switches to open and the other of the second pair of switches to close.

15. The circuit of claim 13, further comprising an inverter coupled to the analog-to-digital converter and configured to invert the sign bit to generate an inverted sign bit, wherein the inverted sign bit is used to control the fourth pair of switches.

16. The circuit of claim 15, wherein the inverted sign bit causes one of the fourth pair of switches to open and the other of the fourth pair of switches to close.

17. An apparatus, comprising:
a pair of high side transistors coupled to a power supply node;
a pair of low side transistors coupled to the pair of high side transistors;
a first sense resistor coupled to one of the low side transistors at a first sense node;
a second sense resistor coupled to one of the other of the low side transistors at a second sense node, wherein the first and second sense resistors are coupled together at a ground node;
an analog-to-digital converter (ADC);
a first switch network coupled to the first sense resistor and, via first and second output nodes, to the ADC;
a second switch network coupled to the second sense resistor and, via third and fourth output nodes, to the ADC;
a first pair of switches configured to use a sign bit from the ADC to selectively provide a potential of the ground node or a potential of the first sense node as a ground potential to the first switch network; and
a second pair of switches configured to use the sign bit from the ADC to selectively provide the potential of the ground node or a potential of the second sense node as a ground potential to the second switch network.

18. The apparatus of claim 17, wherein:
the first pair of switches is configured such that the sign bit causes one of the first pair of switches to open and the other of the first pair of switches to close; and
the second pair of switches is configured such that an inverse of the sign bit causes one of the second pair of switches to open and the other of the second pair of switches to close.

19. The apparatus of claim 17, wherein the first switch network comprises:
a first resistor;
a second resistor; and
a third plurality of switches coupled to the first and second resistors, wherein the third plurality of switches is configured to selectively couple the first resistor between the first sense node and the first output node of the first switch network and between the ground node and the second output node of the first switch network.

20. The apparatus of claim 19, wherein the second switch network comprises:
   a third resistor;
   a fourth resistor; and
   a fourth plurality of switches coupled to the third and fourth resistors, wherein the fourth plurality of switches is configured to selectively couple the third resistor between the second sense node and the third output node of the second switch network and between the ground node and the fourth output node of the second switch network.

* * * * *